(12) United States Patent
Tang et al.

(10) Patent No.: US 9,252,790 B2
(45) Date of Patent: Feb. 2, 2016

(54) LOCKING MULTIPLE VOLTAGE-CONTROLLED OSCILLATORS WITH A SINGLE PHASE-LOCKED LOOP

(71) Applicant: QUALCOMM Incorporated, San Diego, CA (US)

(72) Inventors: Yiwu Tang, San Diego, CA (US); Jong Min Park, San Diego, CA (US); Serkan Sayilir, Bingol (TR); Chiewcharn Narathong, Laguna Niguel, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 48 days.

(21) Appl. No.: 14/251,331

(22) Filed: Apr. 11, 2014

(65) Prior Publication Data

US 2015/0295583 A1 Oct. 15, 2015

(51) Int. Cl.
*H03L 7/099* (2006.01)
*H03L 7/081* (2006.01)

(52) U.S. Cl.
CPC .............. *H03L 7/099* (2013.01); *H03L 7/081* (2013.01)

(58) Field of Classification Search
CPC .................................. H03L 7/099; H03L 7/08
USPC ........ 331/2, 46, 48, 50, 51, 56; 327/105, 150, 327/159
See application file for complete search history.

(56) References Cited

U.S. PATENT DOCUMENTS

| | | | |
|---|---|---|---|
| 5,909,149 A | 6/1999 | Bath et al. | |
| 7,466,173 B2 | 12/2008 | Burgess | |
| 7,548,120 B2* | 6/2009 | Lam et al. | 331/2 |
| 8,130,044 B2 | 3/2012 | Bereza et al. | |
| 8,130,047 B2 | 3/2012 | Finocchiaro et al. | |
| 8,344,772 B2* | 1/2013 | Lee et al. | 327/156 |
| 8,378,723 B1 | 2/2013 | Atesoglu | |
| 2010/0007389 A1 | 1/2010 | Li et al. | |
| 2012/0112841 A1* | 5/2012 | Hayashi | 331/2 |
| 2013/0181756 A1* | 7/2013 | Ballantyne et al. | 327/157 |
| 2014/0103976 A1* | 4/2014 | Nonis et al. | 327/158 |

FOREIGN PATENT DOCUMENTS

EP 1115205 A1 7/2001

OTHER PUBLICATIONS

International Search Report and Written Opinion—PCT/US2015/020934—ISA/EPO—Jun. 10, 2015.

\* cited by examiner

*Primary Examiner* — Jeffrey Shin
(74) *Attorney, Agent, or Firm* — Patterson & Sheridan, L.L.P.

(57) ABSTRACT

Locking multiple VCOs to generate a plurality of LO frequencies, including: receiving a plurality of divided VCO feedback signals from a plurality of VCOs; receiving a reference signal multiplied by a predetermined number of the plurality of VCOs; generating and processing the predetermined number of phase differences between the multiplied reference signal and the plurality of divided VCO feedback signals in a single PLL circuit including a digital loop filter to receive and process the phase differences and generate (produce) a filter output, wherein the digital loop filter includes a plurality of delay cells equal to the predetermined number; and generating and outputting (delayed) control voltages for the plurality of VCOs based on the filter output.

12 Claims, 7 Drawing Sheets

US 9,252,790 B2

LOCKING MULTIPLE VOLTAGE-CONTROLLED OSCILLATORS WITH A SINGLE PHASE-LOCKED LOOP

BACKGROUND

1. Field

This invention relates to a phase-locked loop (PLL), and more specifically, to generating multiple local oscillation (LO) frequencies using a single PLL to lock multiple voltage-controlled oscillators (VCOs).

2. Background

In transceiver circuits that support carrier aggregation, multiple receiver and transmitter synthesizers are needed, one for each local oscillator frequency. For example, for three downlink and two uplink carrier aggregation, five synthesizers are needed. This configuration requires large amount of silicon area from each phase locked loop (PLL).

SUMMARY

The present invention provides methods, circuits, apparatus, and computer programs to lock multiple voltage-controlled oscillators (VCOs) for generating a plurality of local oscillator (LO) frequencies.

In one embodiment, system including a phase-locked loop (PLL) circuit configured to lock multiple VCOs for generating a plurality of LO frequencies is disclosed. The system includes: a plurality of VCOs, each VCO generating an output signal of a particular frequency; a plurality of dividers, each divider configured to divide the output signal of a corresponding VCO, the plurality of dividers generating a plurality divided VCO feedback signals; a phase-to-digital converter (PDC) configured to receive a plurality of divided VCO feedback signals from the plurality of dividers and a reference signal multiplied by a predetermined number indicating a number of the plurality of VCOs, and to generate the predetermined number of phase differences between the multiplied reference signal and the plurality of divided VCO feedback signals; a digital loop filter configured to receive and process the phase differences and generate a filter output, wherein the digital loop filter includes a plurality of delay cells equal to the predetermined number; and a digital-to-analog converter (DAC) configured to output control voltages for the plurality of VCOs based on the filter output.

In another embodiment, a method to lock multiple VCOs to generate a plurality of LO frequencies is disclosed. The method includes: receiving a plurality of divided VCO feedback signals from a plurality of VCOs; receiving a reference signal multiplied by a predetermined number of the plurality of VCOs; generating and processing the predetermined number of phase differences between the multiplied reference signal and the plurality of divided VCO feedback signals in a single PLL circuit including a digital loop filter to receive and process the phase differences and generate a filter output, wherein the digital loop filter includes a plurality of delay cells equal to the predetermined number; and generating and outputting control voltages for the plurality of VCOs based on the filter output.

In another embodiment, an apparatus to lock multiple VCOs for generating a plurality of LO frequencies is disclosed. The apparatus includes: means for receiving a plurality of divided VCO feedback signals from a plurality of VCOs; mean for receiving a reference signal multiplied by a predetermined number of the plurality of VCOs; mean for generating and processing the predetermined number of phase differences between the multiplied reference signal and the plurality of divided VCO feedback signals in a single PLL circuit including a digital loop filter to receive and process the phase differences and generate a filter output, wherein the digital loop filter includes a plurality of delay cells equal to the predetermined number; and means for generating and outputting control voltages for the plurality of VCOs based on the filter output.

In yet another embodiment, a non-transitory storage medium storing a computer program to lock multiple VCOs for generating a plurality of LO frequencies is disclosed. The computer program includes executable instructions that cause a computer to: receive a plurality of divided VCO feedback signals from a plurality of VCOs; receive a reference signal multiplied by a predetermined number of the plurality of VCOs; generate and process the predetermined number of phase differences between the multiplied reference signal and the plurality of divided VCO feedback signals in a single PLL circuit including a digital loop filter to receive and process the phase differences and generate a filter output, wherein the digital loop filter includes a plurality of delay cells equal to the predetermined number; and generate and output control voltages for the plurality of VCOs based on the filter output.

Other features and advantages of the present invention should be apparent from the present description which illustrates, by way of example, aspects of the invention.

BRIEF DESCRIPTION OF THE DRAWINGS

The details of the present invention, both as to its structure and operation, may be gleaned in part by study of the appended further drawings, in which like reference numerals refer to like parts, and in which.

DETAILED DESCRIPTION

As described above, in some systems, multiple receiver and transmitter synthesizers are needed, but this configuration requires large amount of silicon area. Certain embodiments as described herein provide for efficiently generating multiple local oscillator frequencies using a single phase-locked loop (PLL) to lock multiple voltage-controlled oscillators (VCOs) which reduces the die area and complexity. After reading this description it will become apparent how to implement the invention in various implementations and applications. Although various implementations of the present invention will be described herein, it is understood that these implementations are presented by way of example only, and not limitation. As such, this detailed description of various implementations should not be construed to limit the scope or breadth of the present invention.

In one of the proposed embodiments, one digital PLL is used to lock multiple VCOs (e.g., K number of VCOs). The phase-to-digital converter (PDC) takes K times the reference frequency ($F_{ref}$) signal and K number of divided VCO frequency signals from K VCOs ($F_{v1}, \ldots F_{vK}$) as inputs. The PDC generates K interleaved signals of phase differences between $K^*F_{ref}$ and $F_{v1}, \ldots F_{vK}$ and sends the phase differences to a digital loop filter, which processes the phase differences that reuses the majority of the digital hardware, but clocked at K times the reference frequency. The output of the digital loop filter is then sent to a digital-to-analog converter (DAC) that uses a single decoder and K buffers whose outputs control K number of VCOs and complete the loop.

Figure 1:
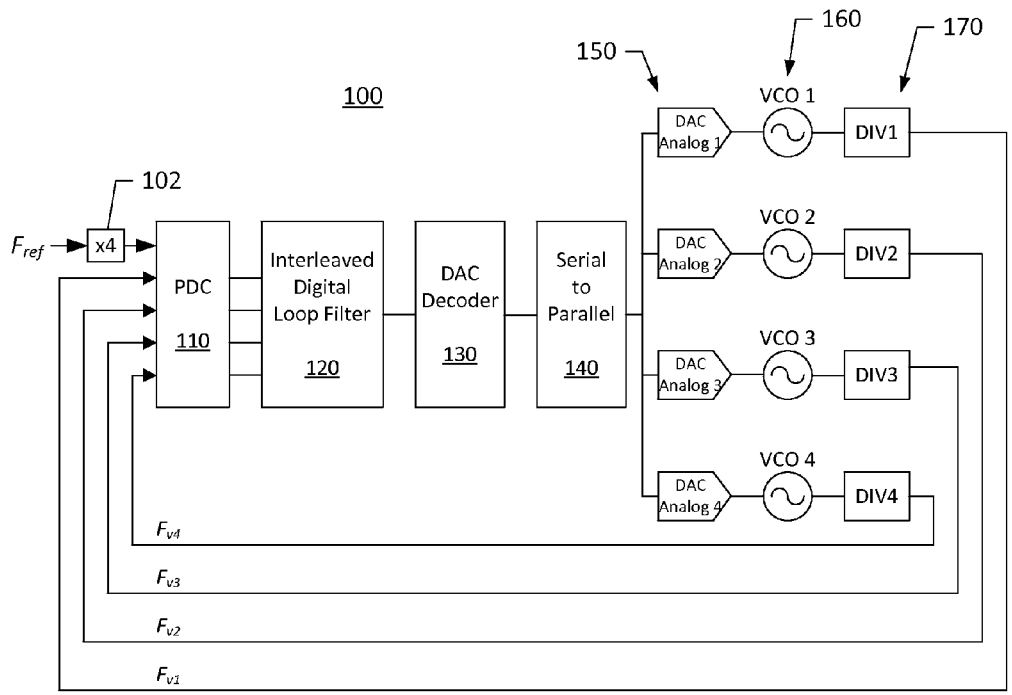
FIG. 1 is a functional block diagram illustrating a system with one digital PLL locking four VCOs in accordance with one example embodiment of the present invention.
Figure 2:
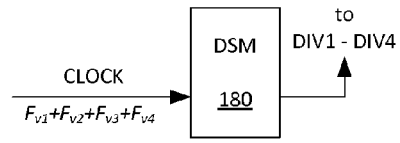
FIG. 2 is a functional block diagram of a digital loop filter which is configured to lock two VCO units in accordance with one embodiment of the present invention.
Figure 2:
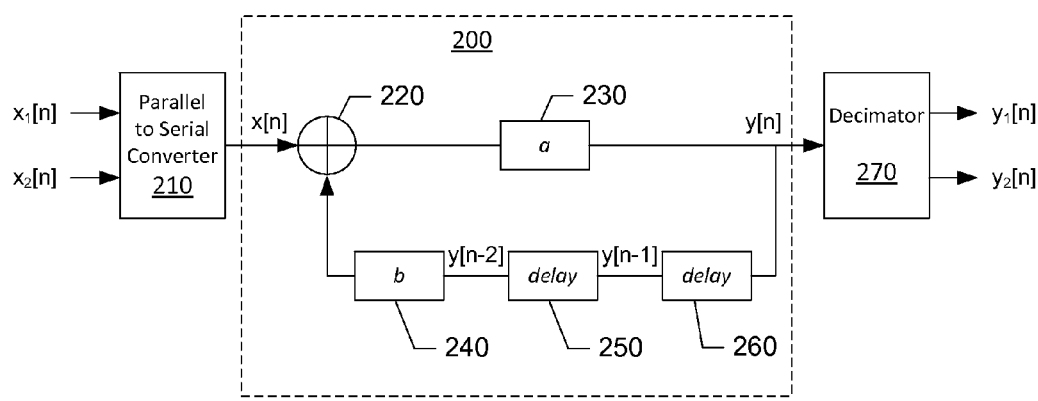

FIG. 1 is a functional block diagram illustrating a system 100 with one digital PLL locking four VCOs in accordance with one example embodiment of the present invention. In the illustrated embodiment of FIG. 1, the PDC 110 receives a multiplied reference signal ($4^*F_{ref}$) and four divided VCO feedback signals ($F_{v1}, F_{v2}, F_{v3}, F_{v4}$) from four VCOs ($VCO_1, VCO_2, VCO_3, VCO_4$) as inputs. The term "divided VCO feedback signal" refers to an output signal of a VCO divided by a divider 170. The reference signal is multiplied by four as $4^*F_{ref}$ in a unit 102. The PDC 110 generates four interleaved signals of phase differences between $4^*F_{ref}$ and $F_{v1}, F_{v2}, F_{v3}, F_{v4}$. The PDC 110 then sends the phase differences to a digital loop filter 120, which processes the phase differences that reuses the majority of the digital hardware. In one embodiment, the digital loop filter 120 is configured as an impulse response filter with a gain of 'a' and a pole at 'b' with one delay cell (e.g., a register) inserted in the loop of the filter for each phase difference signal. Thus, four delay cells would be needed for the illustrated embodiment of FIG. 1 having four VCOs. The detail implementation of a digital loop filter which locks two VCOs is illustrated in FIG. 2. The output of the digital loop filter 120 is then sent to a digital-to-analog converter (DAC) decoder 130 that uses, in one example, a single decoder and four buffers. The output of the DAC decoder 130 is routed through a serial-to-parallel unit 140 and four DAC units 150 to control the four VCO units 160. Frequency divider units 170 complete the loop. The four frequency divider units 170 are controlled by a delta sigma modulator (DSM) 180 which is clocked at the sum of the four frequencies ($F_{v1}, F_{v2}, F_{v3}, F_{v4}$).

FIG. 2 is a functional block diagram of a digital loop filter 200 which is configured to lock two VCO units in accordance with one embodiment of the present invention. In one embodiment, the digital loop filter 200 is a detailed implementation of the digital loop filter 120. The illustrated embodiment of the digital loop filter 200 has a gain of 'a' and a pole at 'b'. Thus, the filter 200 uses one extra delay cell (e.g., a register) in the loop of the filter 120 for each additional VCO, but all combinational logic can be shared. The digital loop filter 200 includes a summing unit 220, a filter gain unit 230, and loop elements 240, 250, 260 (which may include delay cells 250, 260). The functional block diagram of FIG. 2 further includes a parallel-to-serial converter 210 and a decimator 270 for the illustrative purposes. However, the parallel-to-serial converter 210 is typically included in the PDC, while the decimator 270 may be included in the serial-to-parallel converter 140.

The illustrated embodiment of FIG. 2 shows the digital loop filter 200 for a two VCO case. In this embodiment, the digital loop filter 200 receives two input signals ($x_1[n]$ and $x_2[n]$). The summing unit 220, the filter gain unit 230, and the loop elements 240, 250, 260 process the input signals ($x_1[n]$ and $x_2[n]$) into output signals ($y_1[n]$ and $y_2[n]$) with a gain of 'a' and a pole at 'b' as follows:

$$y_1[n]=a^*x_1[n]+b^*y_1[n-1] \tag{1}$$

$$y_2[n]=a^*x_2[n]+b^*y_2[n-1] \tag{2}$$

The parallel-to-serial converter 210 combines $x_1[n]$ and $x_2[n]$ into x[n] and the decimator 270 decimates the output signal y[n] into $y_1[n]$ and $y_2[n]$ as follows:

$$x[2n]=x_1[n], x[2n+1]=x_2[n] \tag{3}$$

$$y[2n]=y_1[n], y[2n+1]=y_2[n] \tag{4}$$

Then, equations (1) and (2) become:

$$y[2n]=a^*x[2n]+b^*y[2n-2] \tag{5}$$

$$y[2n+1]=a^*x[2n+1]+b^*y[2n-1] \tag{6}$$

Equations (5) and (6) are equivalent to $$y[n]=a^*x[n]+b^*y[n-2] \tag{7}$$

Therefore, equation (7) can be implemented by having two delay cells 250, 260 as shown in FIG. 2. Further, coefficients a and b are programmable to different values for different configurations of the digital loop filter 200. Extending the example shown in FIG. 2, control signals for K number of VCOs can be generated by using K delay cells.

Figure 3:
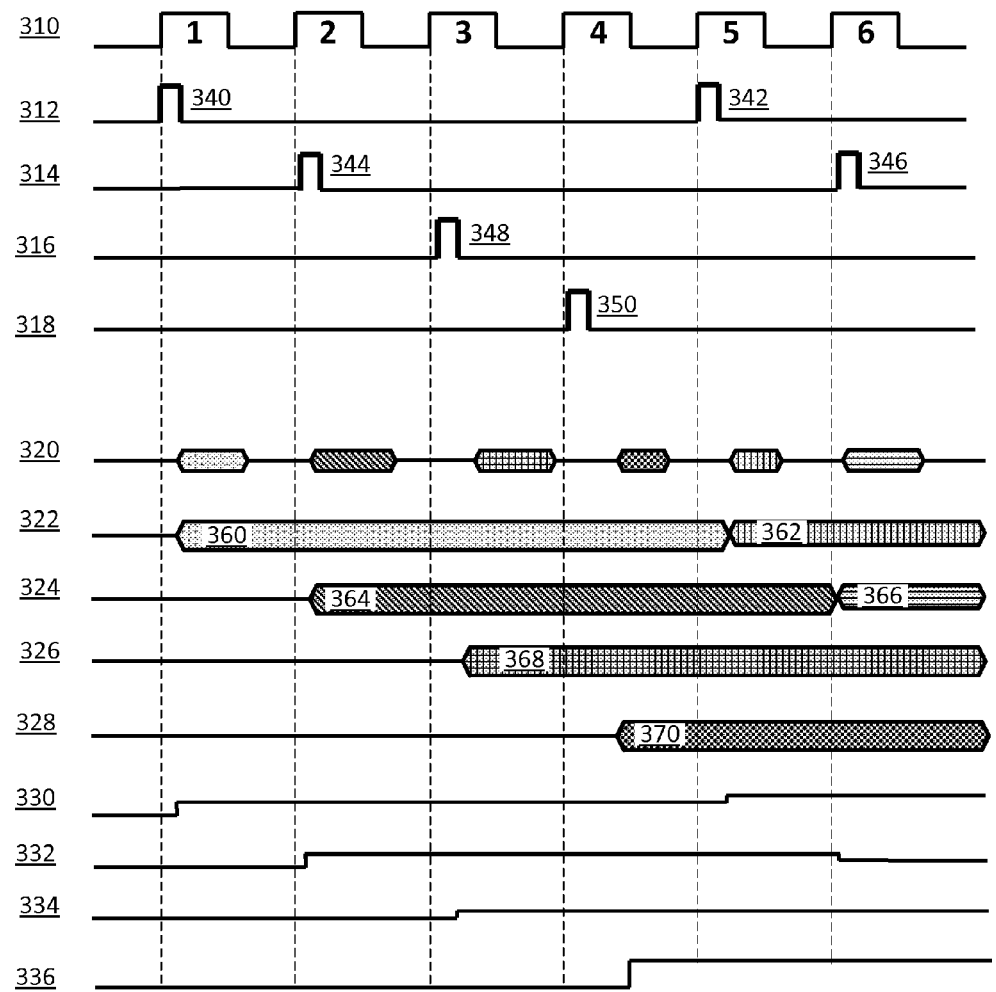
FIG. 3 is a timing diagram of the system shown in FIG. 1 in accordance with one embodiment of the present invention.

FIG. 3 is a timing diagram of the system 100 shown in FIG. 1 in accordance with one embodiment of the present invention. As stated above, the system 100 is configured with one PLL locking four VCOs. As illustrated in FIG. 3, the reference signal 310 is clocked at four times the reference frequency ($F_{ref}$). In a more general case where there are K VCOs, the reference signal would be clocked at K times the reference frequency. Further, the timing diagrams of the four divided VCO feedback signals ($F_{v1}/F_{v2}, F_{v3}, F_{v4}$) are shown as diagrams 312, 314, 316, 318, respectively. The first divided VCO feedback signal ($F_{v1}$) 312 triggers at the first rising edge of the reference signal 310; the second divided VCO feedback signal ($F_{v2}$) 314 triggers at the second rising edge of the reference signal 310; the third divided VCO feedback signal ($F_{v3}$) 316 triggers at the third rising edge of the reference signal 310; and the fourth divided VCO feedback signal ($F_{v4}$) 318 triggers at the fourth rising edge of the reference signal 310. The timing diagram shows that the first divided VCO feedback signal 312 also triggers at the fifth rising edge of the reference signal 310; the second divided VCO feedback signal 314 triggers at the sixth rising edge of the reference signal; and so on.

The phase differences processed by the digital loop filter 120 are shown as a serial signal 320. Further, the serial (serialized version) signal 320 is converted into four parallel control signals 322, 324, 326, 328 which are then output to four DAC analog units 150. The first control signal 322 maintains a first value 360 from the first rising edge 340 to the second rising edge 342 of the first divided VCO feedback signal ($F_{v1}$) 312 and changes to a second value 362 with the second rising edge 342. The second control signal 324 maintains a first value 364 from the first rising edge 344 to the second rising edge 346 of the second divided VCO feedback signal ($F_{v2}$)

314 and changes to a second value 366 with the second rising edge 346. The third and fourth control signals 326, 328 are processed similarly (first values 368, 370 of the third and fourth control signals 326, 328 are shown). The processed control signals 322, 324, 326, 328 are then converted into analog control voltages 330, 332, 334, 336, respectively, by the four DAC analog units 150. In the illustrated embodiment of FIG. 3, the control voltages 330, 332, 334, 336 are four voltages that control the four VCOs 160.

Figure 4:
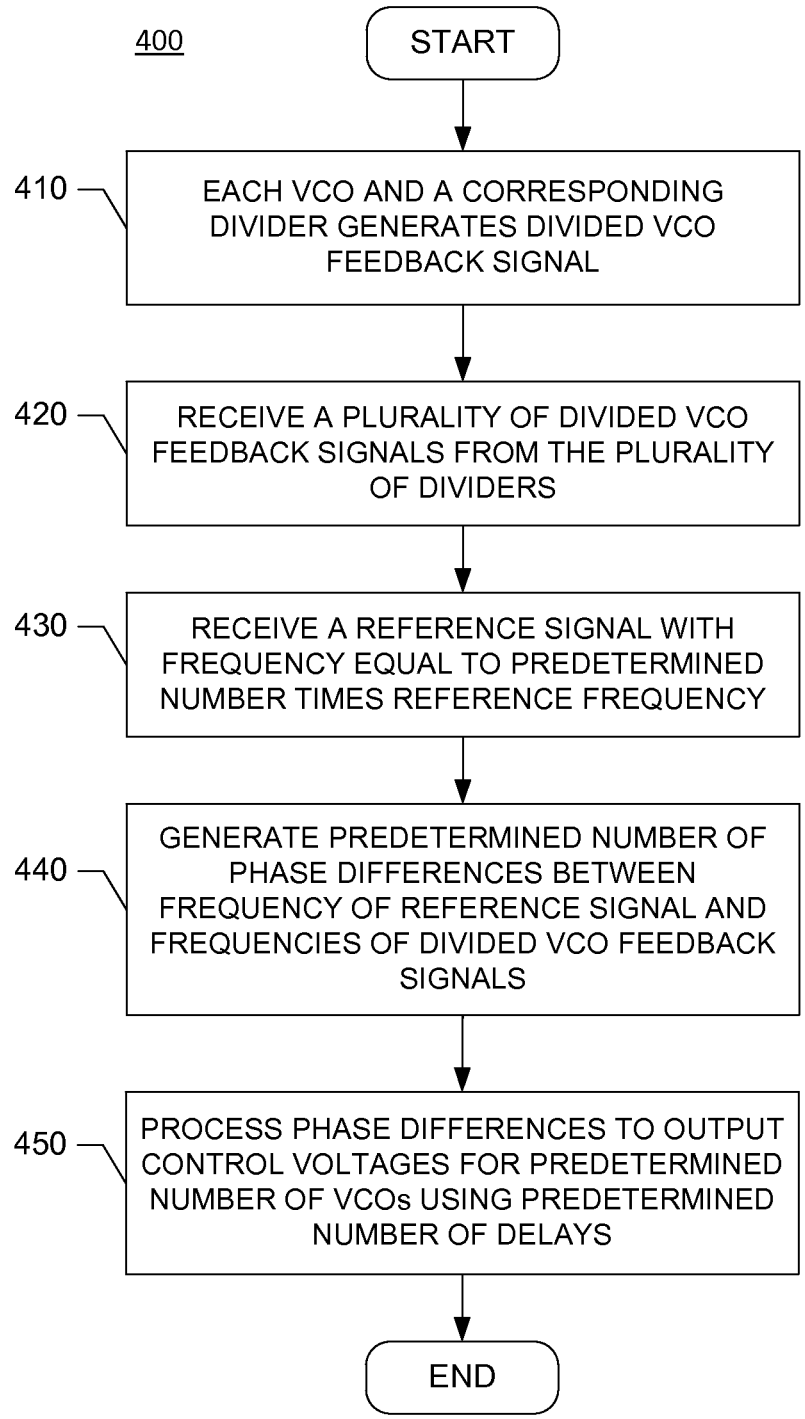
FIG. 4 is a functional flow diagram of a process for locking a predetermined number of VCOs using a single PLL in accordance with one embodiment of the present invention.

FIG. 4 is a functional flow diagram of a process 400 for locking a predetermined number of VCOs using a single PLL in accordance with one embodiment of the present invention. In the illustrated embodiment of FIG. 4, the process 400 includes each VCO of the predetermined number of VCOs and a corresponding divider generating a divided VCO feedback signal, at step 410. A plurality of the divided VCO feedback signals (e.g., a predetermined number K) is received, at step 420, from the plurality of dividers. Then, at step 430, a reference signal with a frequency equal to the predetermined number times a reference frequency is received. A predetermined number of phase differences between the frequency of the reference signal and frequencies of the plurality of divided VCO feedback signals are generated, at step 440. The phase differences are then processed to output a plurality of control voltages for the predetermined number of VCOs, at step 450. In one embodiment, the phase differences are processed in an interleaved mode and the output control voltages are generated using a digital loop filter including a predetermined number (e.g., K) of delays as illustrated and described in connection with FIG. 2.

Referring back to FIG. 3, each divided VCO feedback signal ($F_{v1}$, $F_{v2}$, . . . , $F_{vK}$) 312, 314, 316, 318 needs to be confined within one distinct reference clock period for the time multiplexing to work properly. However, the timing of the divided VCO feedback signals may be arbitrary after the coarse tuning of the VCOs, but prior to the fine tuning. Accordingly, in a further embodiment, initial phase adjustment is made to the timing of the divided VCO feedback signals, $F_{v1}$, $F_{v2}$, . . . , $F_{vK}$ between the coarse tuning and the fine tuning of the VCOs.

Figure 5:
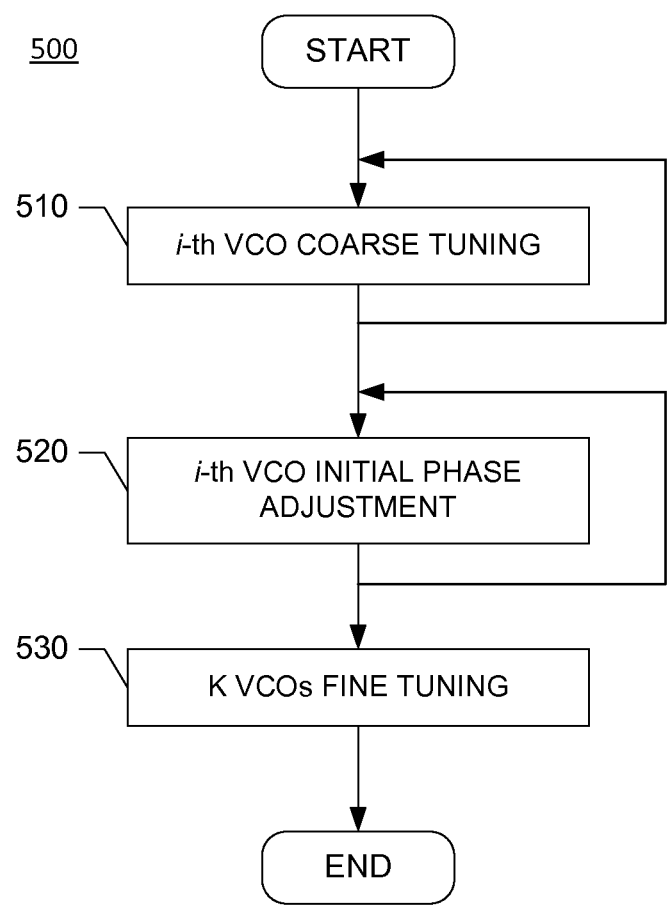
FIG. 5 is a functional flow diagram of a process for locking a predetermined number (e.g., K) of VCOs using a single PLL in accordance with another embodiment of the present invention.
Figure 7:
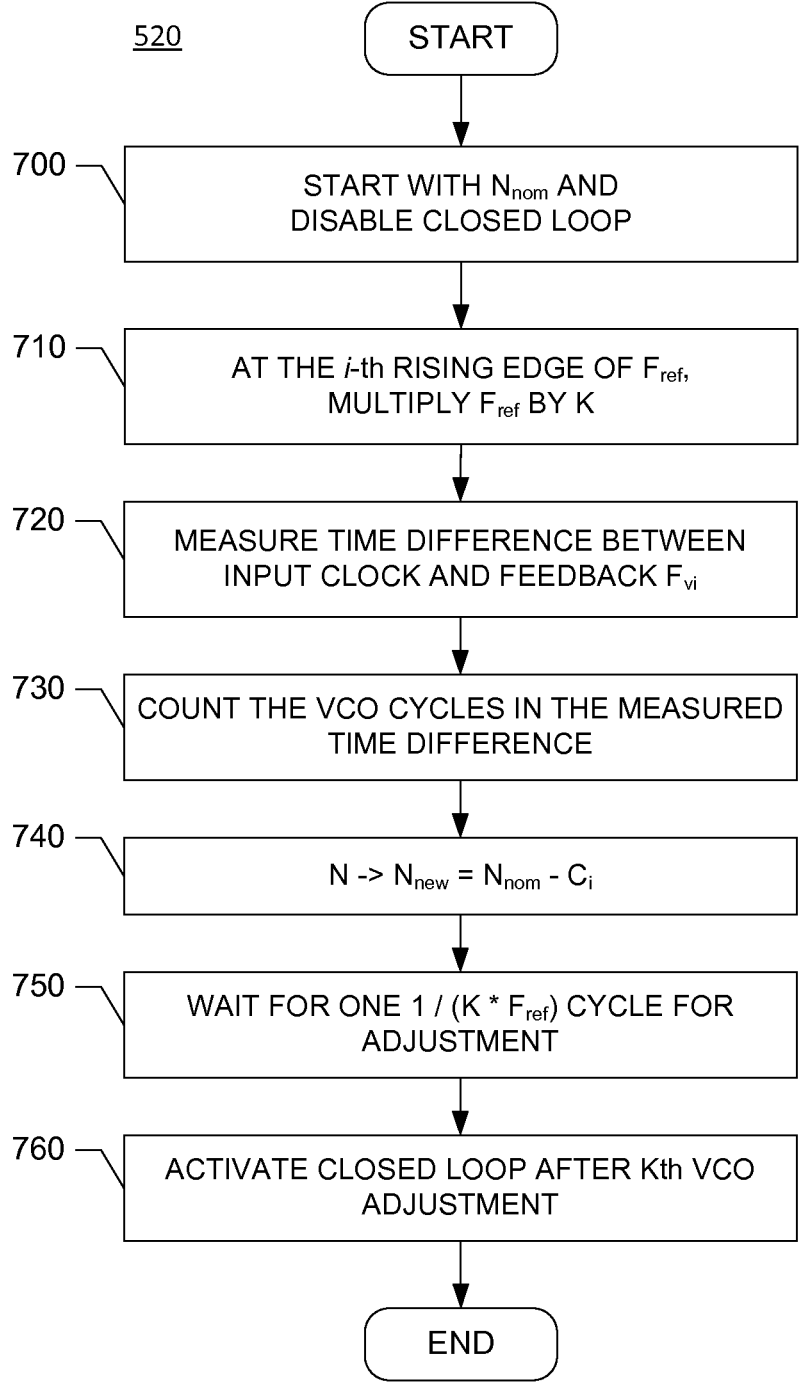
FIG. 7 is a functional flow diagram of a process for the initial phase adjustment in accordance with one embodiment of the present invention.
Figure 8:
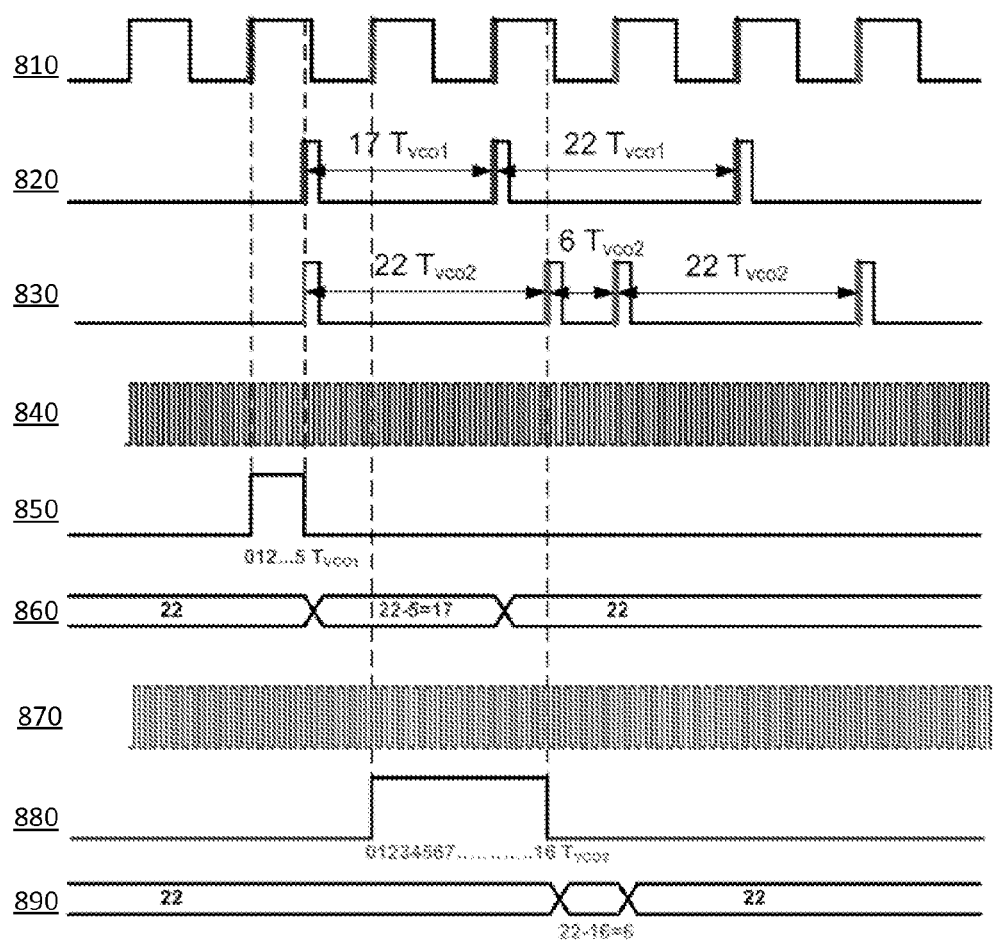
FIG. 8 is a timing diagram illustrating the implementation of the initial phase adjustment for a two VCO case.

FIG. 5 is a functional flow diagram of a process 500 for locking or tuning a predetermined number (e.g., K) of VCOs using a single PLL in accordance with another embodiment of the present invention. In the illustrated embodiment of FIG. 5, the process 500 initiates, at step 510, by coarse tuning of the VCOs. An initial phase adjustment is then made, at step 520. The details of the initial phase adjustment are illustrated in FIG. 7 and FIG. 8. The process 500 finishes with a fine tuning of the VCOs, at step 530.

Figure 6A:
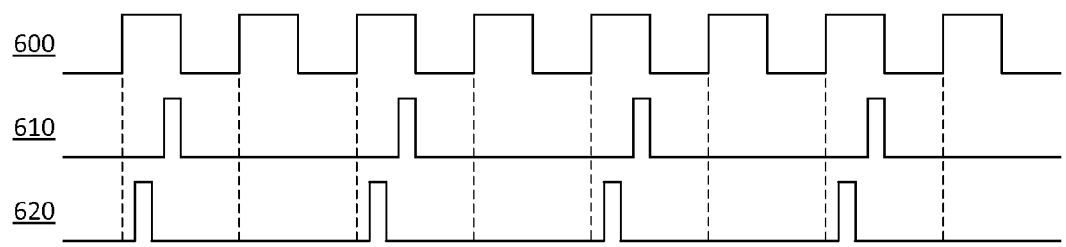
FIG. 6A is a timing diagram illustrating the timing of the divided feedback signals from two VCOs without the initial phase adjustment.

FIG. 6A is a timing diagram illustrating the timing of the divided VCO feedback signals from two VCOs without the initial phase adjustment. The diagram 600 shows the timing of the reference clock, while the diagrams 610 and 620 show the timing of the divided VCO feedback signals $F_{v1}$ and $F_{v2}$ from $VCO_1$ and $VCO_2$, respectively. As stated above, the timing of the divided VCO feedback signals 610, 620 is arbitrary.

Figure 6B:
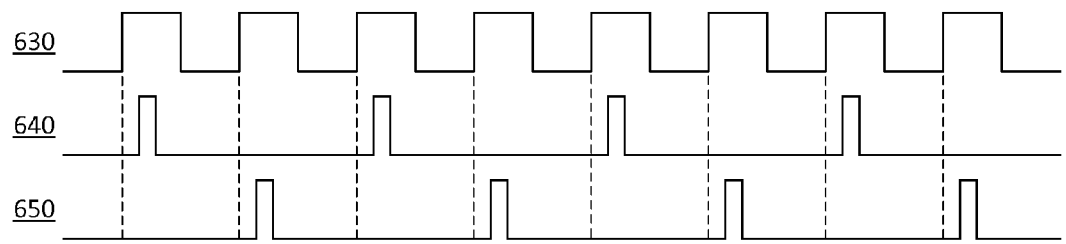
FIG. 6B is a timing diagram illustrating the timing of the divided feedback signals from two VCOs after the initial phase adjustment has been made.

FIG. 6B is a timing diagram illustrating the timing of the divided VCO feedback signals from two VCOs, after the initial phase adjustment has been made. The diagram 630 shows the timing of the reference clock, while the diagrams 640 and 650 show the timing of the divided VCO feedback signals $F_{v1}$ and $F_{v2}$ from $VCO_1$ and $VCO_2$, respectively. As stated above, the timing of the divided VCO feedback signals 640,650 has now been adjusted and each divided VCO feedback signal is confined within one distinct reference clock period.

FIG. 7 is a functional flow diagram of a process 520 for the initial phase adjustment in accordance with one embodiment of the present invention. In the illustrated embodiment of FIG. 7, the close loop is disabled and a fixed number (e.g., $N_{nom}$) is set for the number of VCO cycles between the rising edges of each divided VCO feedback signal ($F_{vi}$), at step 700. At the i-th rising edge of the reference frequency, multiply the reference frequency by the number of VCOs (i.e., K), at step 710, to generate an input clock ($=K*F_{ref}$). The time difference between the rising edge of the input clock and the rising edge of the divided VCO feedback signal ($F_{vi}$) is then measured, at step 720. The VCO cycles in the measured time difference are counted, at step 730. A new N is calculated, at step 740, as the arbitrary number ($N_{nom}$) minus the time difference count ($C_i$). The i-th adjustment is made, at step 750, using new N after waiting for one over the input clock cycle ($1/(K*F_{ref})$). After the K-th adjustment has been made, the closed loop is activated, at step 760.

FIG. 8 is a timing diagram illustrating the implementation of the initial phase adjustment for a two VCO case. In the illustrated embodiment of FIG. 8, the fixed number ($N_{nom}$) is set at 22. Also, the diagram 810 is the input clock ($K*F_{ref}$) generated in step 710 of FIG. 7. The diagrams 820 and 830 are the divided VCO feedback signals $F_{v1}$ and $F_{v2}$ for $VCO_1$ and $VCO_2$, respectively. Further, the diagram 840 shows the VCO cycles (for $VCO_1$) mentioned in step 730 of FIG. 7. Thus, in accordance with step 730, the VCO cycles in the measured time difference are counted for the first divided VCO feedback signal $F_{v1}$, at diagram 850. The number ($C_i$) for the counted VCO cycles in the measured time difference for the first divided VCO feedback signal $F_{v1}$ (shown in diagram 850) is equal to five. Accordingly, new N for the first divided VCO feedback signal $F_{v1}$ is set at 17 (see diagram 860), which is 22 ($N_{nom}$)−5($C_i$). The diagram 870 shows the VCO cycles (for $VCO_2$) mentioned in step 730 of FIG. 7. The VCO cycles in the measured time difference are counted for the second divided VCO feedback signal $F_{v2}$, at diagram 880. The number ($C_i$) for the counted VCO cycles in the measured time difference for the second divided VCO feedback signal $F_{v2}$ (shown in diagram 880) is equal to sixteen. Accordingly, new N for the second divided VCO feedback signal $F_{v2}$ is set at 6 (see diagram 890), which is 22 ($N_{nom}$)−16($C_i$).

Although several embodiments of the invention are described above, many variations of the invention are possible. For example, although the illustrated embodiments appear to suggest using a phase-to-digital converter, other elements can be used in place of the phase-to-digital converter. For example, a frequency-to-digital converter can be used in place of the phase-to-digital converter. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A system including a phase-locked loop (PLL) circuit configured to lock multiple voltage-controlled oscillators (VCOs) for generating a plurality of local oscillator (LO) frequencies, the system comprising:
    a plurality of VCOs, each VCO generating an output signal of a particular frequency;
    a plurality of dividers, each divider configured to divide the output signal of a corresponding VCO, the plurality of dividers generating a plurality of divided VCO feedback signals;
    a phase-to-digital converter (PDC) configured to receive the plurality of divided VCO feedback signals from the plurality of dividers and a reference signal multiplied by a predetermined number indicating a number of the plurality of VCOs, and to generate the predetermined number of phase differences between the multiplied reference signal and the plurality of divided VCO feedback signals;
    a digital loop filter configured to receive and process the phase differences and generate a filter output,
    wherein the digital loop filter includes a plurality of delay cells equal to the predetermined number; and
    a digital-to-analog converter (DAC) configured to output control voltages for the plurality of VCOs based on the filter output.

2. The system of claim 1, wherein the digital loop filter comprises:
    a filter gain unit to multiply a serialized signal of the predetermined number of phase differences with a filter gain and output a first value;
    the predetermined number of a plurality of delay cells;
    a loop gain unit in the loop to multiply a delayed version of the filter output with a loop gain and output a second value; and
    a summing unit to add the first value and the second value to produce the filter output.

3. A method to lock multiple VCOs to generate a plurality of LO frequencies, the method comprising:
    receiving a plurality of divided VCO feedback signals from a plurality of VCOs;
    receiving a reference signal multiplied by a predetermined number of the plurality of VCOs;
    generating and processing the predetermined number of phase differences between the multiplied reference signal and the plurality of divided VCO feedback signals in a single PLL circuit including a digital loop filter to receive and process the phase differences and generate a filter output,
    wherein the digital loop filter includes a plurality of delay cells equal to the predetermined number; and
    generating and outputting control voltages for the plurality of VCOs based on the filter output.

4. The method of claim 3, wherein the digital loop filter is configured to add one delay cell for each additional VCO to lock.

5. The method of claim 3, wherein processing the predetermined number of phase differences comprises:
    multiplying a serialized signal of the predetermined number of phase differences with a filter gain and outputting a first value;
    multiplying a delayed version of the filter output with a loop gain and outputting a second value; and
    summing the first value and the second value to produce the filter output.

6. An apparatus to lock multiple VCOs for generating a plurality of LO frequencies, the apparatus comprising:
    means for receiving a plurality of divided VCO feedback signals from a plurality of VCOs;
    mean for receiving a reference signal multiplied by a predetermined number of the plurality of VCOs;
    mean for generating and processing the predetermined number of phase differences between the multiplied reference signal and the plurality of divided VCO feedback signals in a single PLL circuit including a digital loop filter to receive and process the phase differences and generate a filter output,
    wherein the digital loop filter includes a plurality of delay cells equal to the predetermined number; and
    means for generating and outputting control voltages for the plurality of VCOs based on the filter output.

7. The apparatus of claim 6, wherein the digital loop filter is configured to add one delay cell for each additional VCO to lock.

8. The apparatus of claim 6, wherein the means for generating and for processing the predetermined number of phase differences comprises:
    means for multiplying a serialized signal of the predetermined number of phase differences with a filter gain and outputting a first value;
    means for multiplying a delayed version of the filter output with a loop gain and outputting a second value; and
    means for summing the first value and the second value to produce the filter output.

9. A non-transitory computer-readable storage medium storing a computer program to lock multiple VCOs for generating a plurality of LO frequencies, the computer program comprising executable instructions that cause a computer to:
    receive a plurality of divided VCO feedback signals from a plurality of VCOs; receive a reference signal multiplied by a predetermined number of the plurality of VCOs;
    generate and process the predetermined number of phase differences between the multiplied reference signal and the plurality of divided VCO feedback signals in a single PLL circuit including a digital loop filter to receive and process the phase differences and generate a filter output, wherein the digital loop filter includes a plurality of delay cells equal to the predetermined number; and generate and output control voltages for the plurality of VCOs based on the filter output.

10. The non-transitory computer-readable storage medium of claim 9, wherein executable instructions that cause the computer to process the predetermined number of phase differences comprise executable instructions that cause the computer to:

multiply a serialized signal of the predetermined number of phase differences with a filter gain and outputting a first value;

multiply a delayed version of the filter output with a loop gain and outputting a second value; and sum the first value and the second value to produce the filter output.

11. The non-transitory computer-readable storage medium of claim 9, wherein executable instructions that cause the computer to process the predetermined number of phase differences comprise executable instructions that cause the computer to:

perform an initial phase adjustment in which each of the plurality of divided VCO feedback signals is adjusted to be confined within one distinct period of the multiplied reference signal.

12. The non-transitory computer-readable storage medium of claim 11, wherein the initial phase adjustment comprises executable instruction that cause the computer to:

measure time differences between a rising edge of the reference signal and rising edges of the plurality of divided VCO feedback signals; and adjust the rising edges of the plurality of divided VCO feedback signals using the time differences.

* * * * *